(12) United States Patent
Chuang et al.

(10) Patent No.: US 7,404,167 B2
(45) Date of Patent: Jul. 22, 2008

(54) METHOD FOR IMPROVING DESIGN WINDOW

(75) Inventors: Harry Chuang, Austin, TX (US); Kong-Beng Thei, Hsin-Chu (TW); Chih-Tsung Yao, Hsinchu (TW); Heng-Kai Liu, Yangmei Township (TW); Ming-Jer Chiu, Hsinchu (TW); Chien-Wen Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 350 days.

(21) Appl. No.: 11/320,513

(22) Filed: Dec. 27, 2005

(65) Prior Publication Data

US 2006/0188824 A1 Aug. 24, 2006

Related U.S. Application Data

(60) Provisional application No. 60/655,540, filed on Feb. 23, 2005.

(51) Int. Cl.
*G06F 17/50* (2006.01)
*G06F 19/00* (2006.01)
*G03F 1/00* (2006.01)
*G21K 5/00* (2006.01)

(52) U.S. Cl. .............................. 716/9; 716/10; 716/21; 700/98; 700/109; 700/120; 700/121; 430/5; 378/35

(58) Field of Classification Search ...................... 716/9, 716/10, 21; 700/98, 109, 120, 121; 430/5; 378/35
See application file for complete search history.

(56) References Cited

U.S. PATENT DOCUMENTS

| | | | | |
|---|---|---|---|---|
| 4,510,616 | A | * | 4/1985 | Lougheed et al. ............ 382/144 |
| 5,729,466 | A | * | 3/1998 | Bamji .......................... 716/10 |
| 5,812,417 | A | * | 9/1998 | Young .......................... 716/9 |
| 5,943,486 | A | * | 8/1999 | Fukui et al. .................... 716/9 |
| 6,026,224 | A | | 2/2000 | Darden et al. |
| 6,385,758 | B1 | * | 5/2002 | Kikuchi et al. ................. 716/2 |
| 6,556,658 | B2 | | 4/2003 | Brennan |
| 7,117,468 | B1 | * | 10/2006 | Teig et al. ..................... 716/11 |
| 7,257,797 | B1 | * | 8/2007 | Waller et al. .................. 716/14 |
| 7,327,591 | B2 | * | 2/2008 | Sadra et al. ................... 365/63 |

(Continued)

OTHER PUBLICATIONS

Rupp, T. S., et al., "High Yielding Self-Aligned Contact Process for a 0.150-µm DRAM Technology," IEEE Transactions on Semiconductor Manufacturing, vol. 15, No. 2, May 2002, pp. 223-228.

*Primary Examiner*—Phallaka Kik
(74) *Attorney, Agent, or Firm*—Slater & Matsil, L.L.P.

(57) ABSTRACT

A method of forming photo masks having rectangular patterns and a method for forming a semiconductor structure using the photo masks is provided. The method for forming the photo masks includes determining a minimum spacing and identifying vertical conductive feature patterns having a spacing less than the minimum spacing value. The method further includes determining a first direction to expand and a second direction to shrink, and checking against design rules to see if the design rules are violated for each of the vertical conductive feature patterns identified. If designed rules are not violated, the identified vertical conductive feature pattern is replaced with a revised vertical conductive feature pattern having a rectangular shape. The photo masks are then formed. The semiconductor structure can be formed using the photo masks.

11 Claims, 9 Drawing Sheets

U.S. PATENT DOCUMENTS

| | | |
|---|---|---|
| 2003/0126582 A1* | 7/2003 | Kobayashi et al. ............ 716/21 |
| 2004/0111682 A1* | 6/2004 | Gopalakrishnan et al. ...... 716/2 |
| 2004/0248045 A1* | 12/2004 | Tanaka et al. ............... 430/312 |
| 2005/0074679 A1* | 4/2005 | Hiroshima .................... 430/5 |
| 2005/0240886 A1* | 10/2005 | Bonges et al. ................. 716/4 |
| 2005/0281098 A1* | 12/2005 | Sadra et al. ................. 365/194 |
| 2006/0168551 A1* | 7/2006 | Mukuno ....................... 716/5 |
| 2006/0190921 A1* | 8/2006 | Kobayasi et al. ............. 716/21 |

* cited by examiner

METHOD FOR IMPROVING DESIGN WINDOW

This application claims priority to provisional application Ser. No. 60/655,540, filed Feb. 23, 2005, entitled "Method & Improvement of Design Window by Using CAD Utility," which application is incorporated herein by reference.

TECHNICAL FIELD

This invention relates generally to semiconductor integrated circuit fabrication processes, and more particularly to the formation of vias and contacts.

BACKGROUND

Modern integrated circuits are made up of literally millions of active devices such as transistors and capacitors. These devices are initially isolated from one another but are later interconnected together to form functional circuits. Typical interconnection structures include lateral interconnections, such as metal lines (wirings), and vertical interconnections, such as vias and contacts. The quality of the interconnection structure drastically affects the performance and reliability of the fabricated circuit. Interconnections are increasingly determining the limits of performance and density of modern integrated circuits.

FIG. 1 is a cross-sectional illustration of a conventional vertical interconnection structure used in the semiconductor industry. Metal lines 104 and 106, which are typically formed of copper, aluminum or alloys thereof, are used to couple active devices (not shown) into functional circuits. A dielectric layer 108 electrically isolates the metal layers in which metal lines 104 and 106 are formed. Electrical connections are made between metal lines 104 and 106 through a metal via 112.

The interconnection structure of FIG. 1 experiences several problems. As integrated circuit dimensions decrease, in order to increase circuit density, vias are becoming smaller by the square of the dimension decrease. Such small vias can cause both reliability and performance problems in an integrated circuit. Reliability problems are caused by high concentrations of current or current crowding effects, which in turn causes self-heating effects, and hence electro-migration. As a result, voids, open circuits and other reliability problems such as high RC delay, which is caused by high contact resistance, arise. Similar problems also occur to contacts, contacts being a term typically used to describe a via between a first metal layer and an underlying active or passive component.

Open circuits and high RC delay are typically solved by redundant vias. U.S. Pat. No. 6,556,658 and U.S. Pat. No. 6,026,224 disclose methods of forming redundant vias in order to improve reliability. With redundant vias, if one of the vias is open or has a high contact resistance, the remaining vias still provide a good contact, and the overall circuit performance is not affected.

Although the addition of the redundant vias reduces the probability of open circuit and/or high RC delay, the distance between the vias decreases. With the scaling of integrated circuits, particularly at 90 nm technology and below, problems such as bird's beak occur. FIG. 2 illustrates a top view of vias having bird's beak effects. Vias 116 and 118 are closely located. Due to optical proximity effects during the exposure of photo resists, via extensions 120 and 122, each having the shape of a bird's beak, are formed. As a result, vias 116 and 118 may short.

Due to the close proximity of the vias and other conductive features in the integrated circuit, it is difficult to move vias away from each other without violating design rules. Therefore, there is a need for a new method of forming vias and photo masks, so that the adverse effects of closely located vias can be avoided.

SUMMARY OF THE INVENTION

The preferred embodiment of the present invention provides a method for forming photo masks having non-square patterns and for forming respective features over a semiconductor substrate using the photo masks.

In accordance with one aspect of the present invention, the method for forming the photo masks includes determining a minimum spacing, and selecting patterns having a spacing less than the minimum spacing, wherein the patterns are for vertical conductive features such as vias and contacts. The method further includes determining a direction to expand and a direction to shrink for each selected pattern, and checking against design rules to see if the design rules are violated. If design rules are not violated, the selected pattern is replaced with a revised pattern having a rectangular shape. The photo masks comprising the rectangular patterns for vertical conductive features are then formed.

In accordance with another aspect of the present invention, the method for forming a semiconductor structure includes forming a first lower level conductive line and a second lower level conductive line, forming a dielectric layer over the first lower level conductive line and the second lower level conductive line, forming a photosensitive layer over the dielectric layer, placing a photo mask over the photosensitive layer wherein the photo mask is formed using the previously discussed steps, exposing and patterning the photosensitive layer, etching the dielectric layer and forming openings, and filling the openings with a conductive material.

In accordance with yet another aspect of the present invention, a semiconductor structure includes a via having a length and a width substantially less than the length. The length and width preferably have a ratio of greater than about 1.05, and more preferably between about 1.05 and 1.4.

In accordance with yet another aspect of the present invention, a semiconductor structure includes a first via and a second via having a first spacing. At least one of the first and second vias has a length and a width substantially less than the length. By forming rectangular vias, the spacing between the vias is increased, hence reducing optical proximity effects.

In accordance with yet another aspect of the present invention, a photo mask for forming vias in integrated circuits includes patterns of the vias. At least one of the patterns has a rectangular shape with a length and a width substantially less than the length. The length and the width have a ratio of between about 1.05 and about 1.4. The photo mask may further include a second pattern and a third pattern for vias, wherein the second pattern is a rectangle and the third pattern is a square, and wherein the first pattern and the third pattern have a spacing less than the spacing between the first pattern and the second pattern.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming photo masks and for forming vertical conductive features is illustrated. The variations of the preferred embodiments are discussed. Throughout the various views and illustrative embodiments of the present invention, like reference numbers are used to designate like elements. For simplicity purposes, the subsequently discussions focus on vias and their formation method. However, the same concepts equally apply to other vertical conductive features, such as contacts. By improving spacing between vertical conductive features, design windows are improved.

Figure 3:
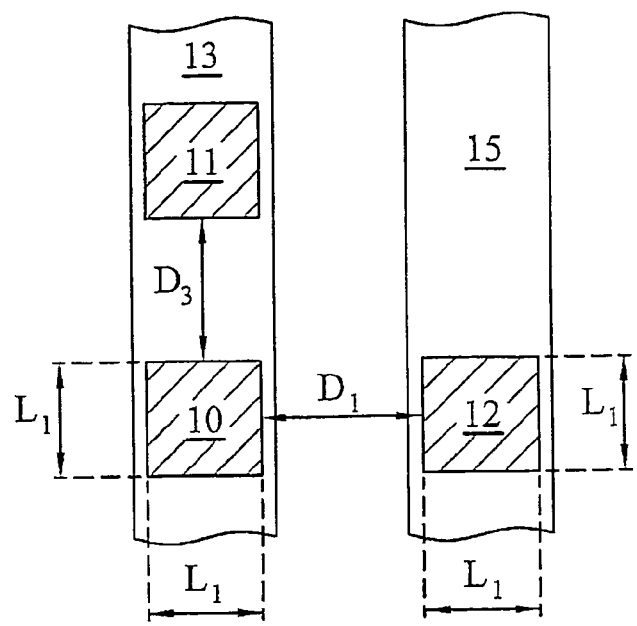
FIG. 3 illustrates a top view of conventional via structures.

FIG. 3 illustrates a top view of two vias 10 and 12, which are connected to metal lines 13 and 15, respectively. Vias 10 and 12 are typically (nominally) squares with each side having a dimension $L_1$. Vias 10 and 12 have a spacing $D_1$. FIG. 3 further illustrates a via 11, which is connected to the via 10 by a metal line 13. Therefore, the via 11 is at a same (voltage) potential as the via 10. The spacing between the vias 10 and 11 is $D_3$.

Figure 1:
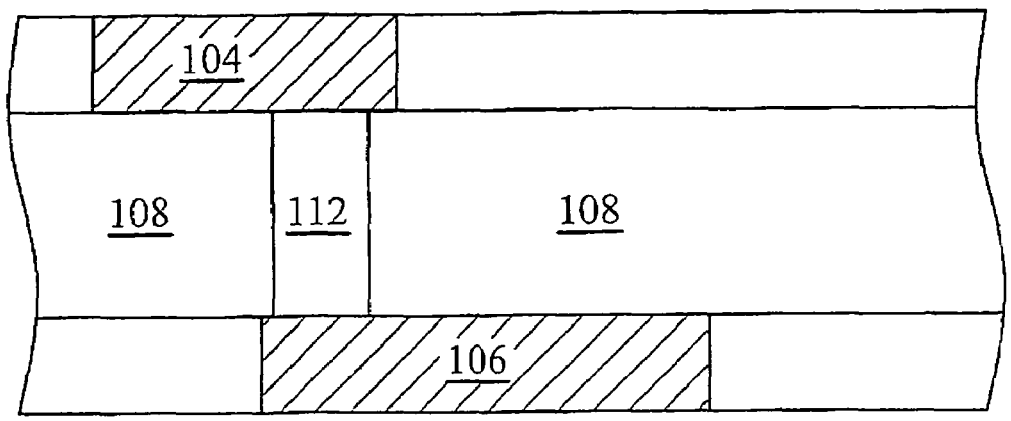
FIG. 1 illustrates a conventional via structure.
Figure 2:
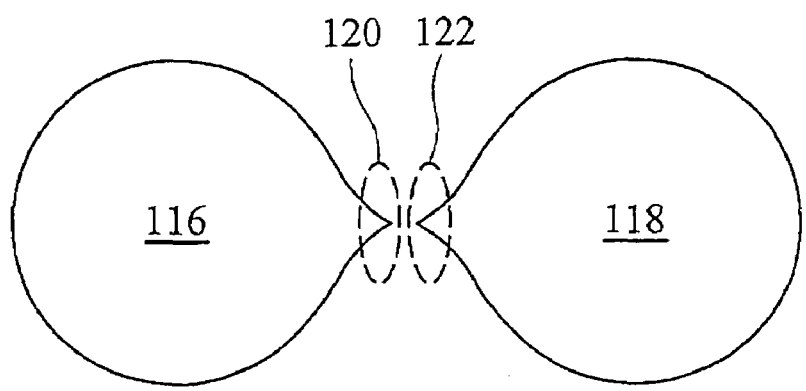
FIG. 2 illustrates via structures having bird's beak effects.

At such a small scale, proximity effects play a significant role. Not only does the shape of the via becomes significantly rounded, bird's beak effects also occur (refer to FIG. 2), causing the shorting of neighboring vias. It is known that the optical proximity effects are affected by the wavelength of the scanner, which is used for exposing photo resists.

Figure 4:
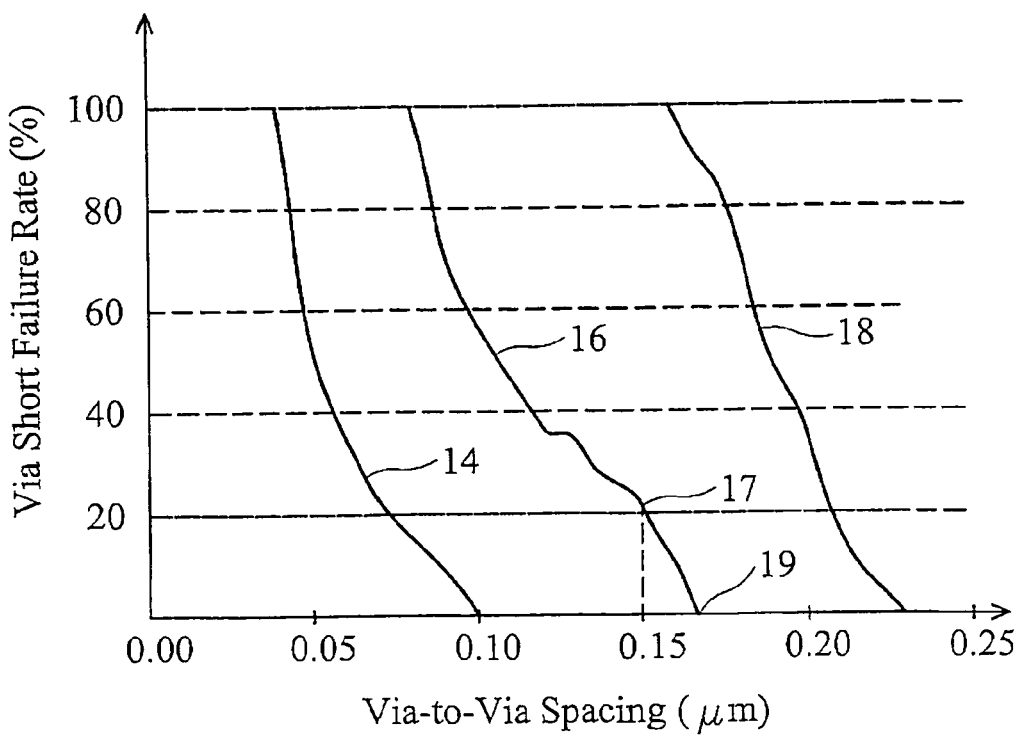
FIG. 4 shows via short failure rate as a function of via to via spacing.

FIG. 4 illustrates simulation results, wherein the via short failure rate is shown as a function of spacing between vias. Line 14 is the simulation result for a 157-scanner, which uses a light having a wavelength of 248 nm. Lines 16 and 18 are simulation results for a 193-scanner and a 248-scanner, which use lights having wavelengths of 193 nm and 157 nm, respectively. Taking the 193-scanner as an example, if the spacing between the vias is 0.15 µm (point 17), vias have a short failure rate of about 22 percent. The short failure rate drops with increased spacing, and drops to zero when the spacing is about 0.17 µm (point 19) or greater. When a scanner with a shorter wavelength is used, via short failure occurs at smaller spacing. For a 157-scanner, a 20 percent failure rate occurs at a spacing of about 0.07 µm. At about 0.10 µm, the short failure rate drops to about zero. The conclusion can thus be drawn that there exists a minimum (via-to-via) spacing beyond which the short failure rate is de minimus, or even zero. In the example shown in FIG. 4, the minimum spacing is about 0.22 um for a 248-scanner, about 0.17 µm for a 193-scanner and about 0.10 µm for a 157-scanner.

The spacing the of vias, therefore, is significant for the yield of integrated circuit fabrication. It is particularly important to increase via-to-via spacing to a value greater than the minimum spacing. However, in a conventional database for layout design, such as an ATI R520 database, the spacing between vias is typically 0.15 µm. (ATI is a semiconductor company located in the United States of America.) This significantly increases the possibility of via short failure. One of the solutions to avoid via short failure is to move the location of vias 10 and 12. However, it is hard to do so without violating other design rules.

Figure 5A:
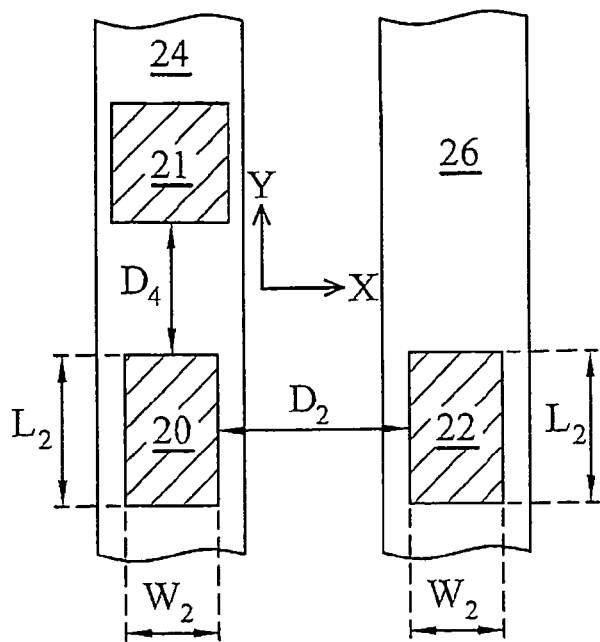
FIGS. 5A through 5F illustrate variations of the preferred embodiments of the present invention.

The preferred embodiments of the present invention are shown in FIGS. 5A through 5F. FIG. 5A illustrates a top view of two nominally rectangular vias 20 and 22 connecting to two metal lines 24 and 26, respectively. Compared to vias 10 and 12 in FIG. 3, the vias 20 and 22 are expanded in a direction (Y direction in this case) parallel to the longitudinal direction of the metal lines 24 and 26 and shrunk in another direction (X direction in this case). Preferably, the vias 20 and 22 have a length $L_2$ of less than about 0.2 µm and a width $W_2$ of less than about 0.13 µm. At 90 nm technology node, $L_2$ is more preferably less than about 0.17 µm. The length $L_2$ is preferably substantially greater than the width $W_2$. The length $L_2$ and width $W_2$ preferably have a ratio of greater than about 1.05, and more preferably between about 1.05 and about 1.4. In order to maintain the contact resistances of the vias 20 and 22 substantially close to the contact resistances of the vias 10 and 12, the area of vias 20 and 22, which equals $L_2*W_2$, is preferably substantially close to or greater than the area of the vias 10 and 12, which is $L_1*L_1$. The spacing $D_2$ is preferably equal or slightly greater than the minimum spacing.

The spacing $D_2$ is greater than the spacing $D_1$ in FIG. 3 due to the fact that the width $W_2$ is reduced. Although the distance $(D_2-D_1)$ is typically a small value, the short failure rate still has a significant improvement.

If vias 20 and 22 have different (voltage) potentials, it is important that they are not shorted, and the spacing is preferably increased. Otherwise, the spacing is preferably not increased. Because vias 20 and 21 have equal potentials, the shorting of the vias 20 and 21 is not a performance and/or reliability affecting problem. Therefore, the distance $D_4$ preferably keeps the same value as $D_3$ in FIG. 3, or can, in fact, be less than $D_3$.

Figure 5B:
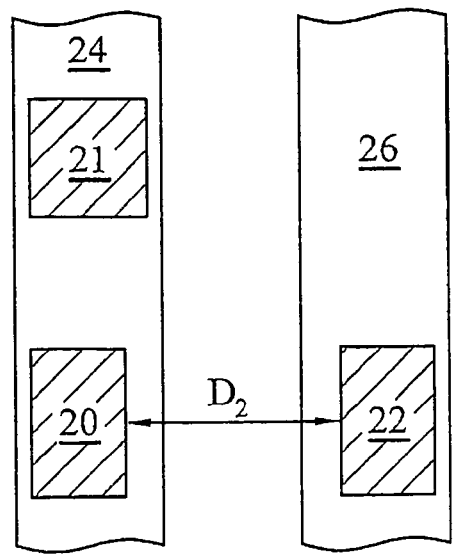

FIGS. 5A through 5F illustrate variations of the preferred embodiments of the present invention. In the preferred embodiment shown in FIG. 5A, vias 20 and 22 are located at substantially the center of the respective metal lines 24 and 26. In other embodiments, as shown in FIG. 5B, vias 20 and 22 are shifted away from each other so that the distance $D_2$ is further increased.

Figure 5C:
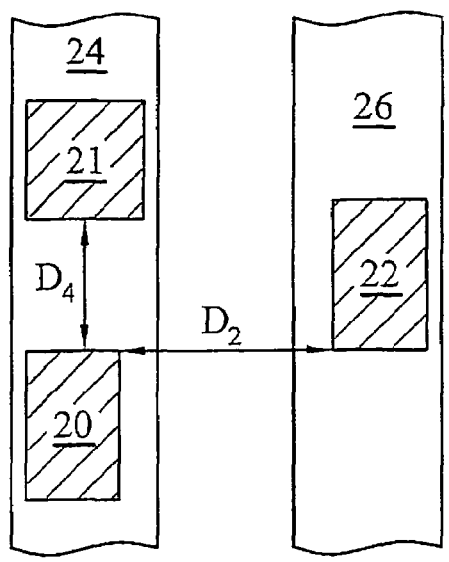

The expansion of the vias is restricted by design rules, and it is not always possible to expand the via in-situ without violating design rules. Sometimes, at least one of the vias 20 and 22 has to be shifted in the length direction of metal lines 24 and 26 to allow room for expansion, as shown in FIG. 5C.

Figure 5D:
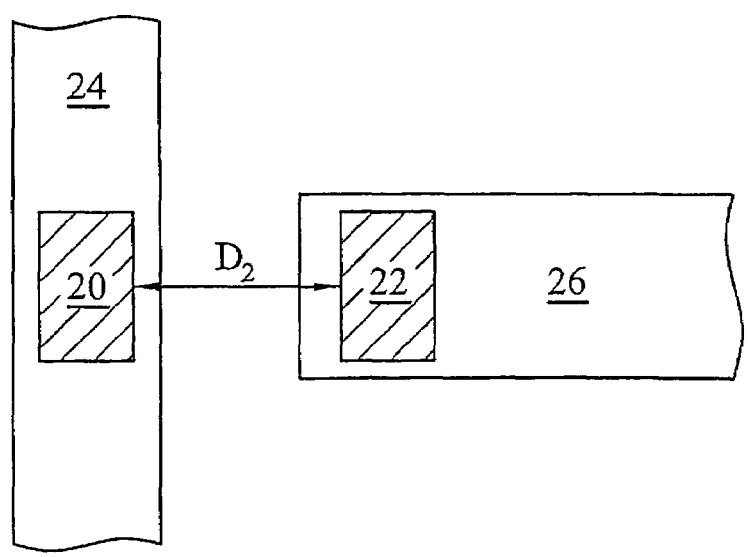
Figure 5E:
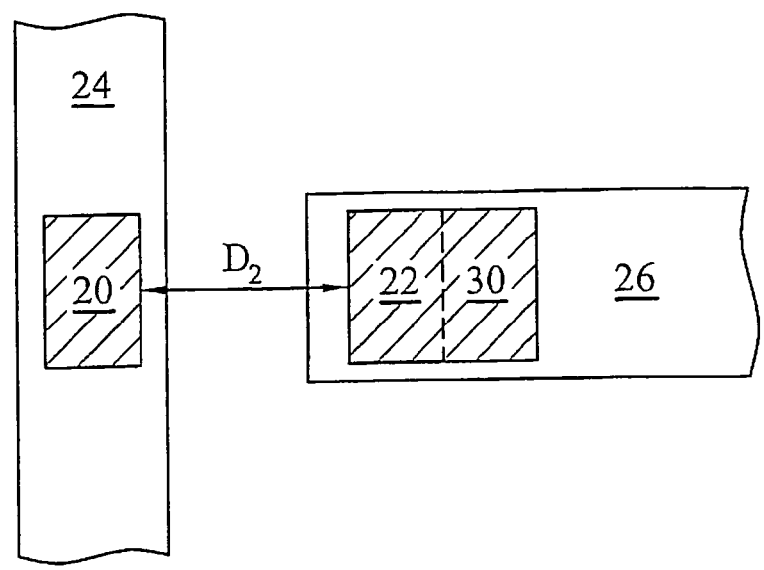

Metal lines connecting to the vias are not necessarily parallel to each other. As shown in FIG. 5D, the metal lines 24 and 26 may be perpendicular to each other. In yet another embodiment, as shown in FIG. 5E, the via 22 may be merged with a redundant via 30.

Figure 5F:
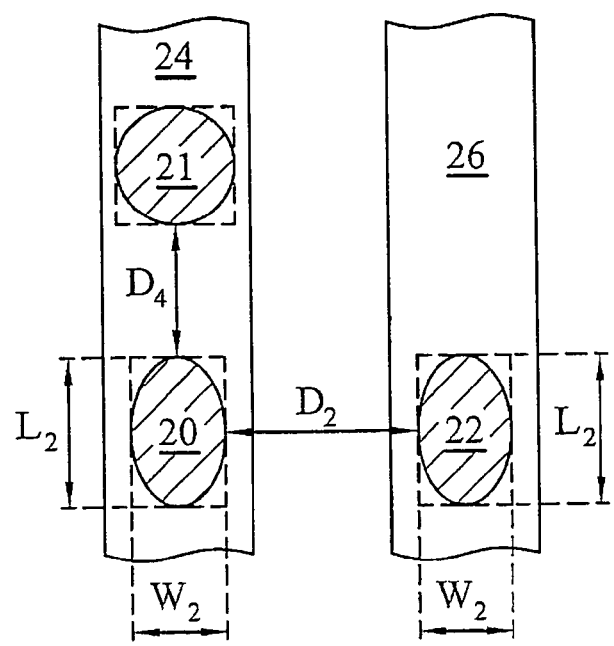

Due to optical effects, the actual vias 20 and 22 may have elliptical shapes, as shown in FIG. 5F, although the photo mask used for forming the vias 20 and 22 have rectangular patterns. The length $L_2$, width $W_2$, and spacing $D_2$ of the elliptical shaped vias preferably have substantially similar dimensions as rectangular shaped vias.

The result of the preferred embodiment of the present invention can be explained using an example. At 90 nm technology node, a conventional layout database has a via-to-via spacing of 0.165 μm, and vias have a size of 0.13 μm*0.13 μm. Using the scheme shown in FIG. 5B, the size of the vias becomes 0.12 μm*0.14 μm, and the spacing is increased to 0.185 μm, which is adequate for overcoming the optical proximity effect when a 193-scanner is used. To reach both low via short rate and high device (and/or via) density of integrated circuits, the via-to-via spacing is preferably about 20 nm to about 70 nm for a 157 nm technology node, about 70 nm to about 150 nm for a 193 nm technology node and about 150 nm to about 220 nm for a 248 nm technology node.

Preferably, a computer aided design (CAD) utility tool is used in the layout design procedure, including repairing vias. The created layout comprising the repaired vias is saved in a database. In order to form vias, photo masks are first created using the database, and each layer for forming the vias and metal lines are then formed using the photo masks. A brief description of an exemplary process is discussed hereafter.

The CAD utility tool first goes through all vias in the database, selecting vias having a spacing less than a predetermined minimum spacing. The CAD utility tool then repairs the selected vias if design rules are not violated. In other words, the tool revises the via layout to comply with the design rules.

For repairing a via, the CAD utility tool first examines the spacing between the currently processed via (a first via) and neighboring vias. The first via and a neighboring via, also referred to as a second via, can be located on a same or different interconnection levels. For example, both the first via and the second via are located on the third metal interconnection level, or the first via is located on the third metal interconnection level, while the second via is located on the fourth metal interconnection level. If any spacing between the first and the second vias is less than the minimum spacing, the electrical potentials (for example, $V_{dd}$ or $V_{ss}$) on the two vias are examined optionally. One way of examining potentials is checking whether there is a physical connection between the vias, although non-physically connected vias may have the same potential. A via needs to be repaired when the spacing between the first via and a non-equal potential second via is less than the minimum spacing. If reshaping the first via alone cannot increase the spacing to greater than the critical value, the option of shifting the vias is evaluated. Although only the repairing of the first via is discussed, since the CAD utility tool traverses each selected via, the second via will also be repaired if necessary. Optionally, the first via and the second via can be repaired at the same time.

If it is found that the via can be repaired by expanding/shrinking (and shifting), the CAD utility tool checks the repaired via against all design rules to make sure no design rule is violated. Please note that each via interconnects two metal layers, and the design rule violation check needs to be performed for both layers. The repaired via is then saved in the database, replacing the first via. If all directions are checked for the first via and no repair is possible, the first via is not repaired.

The CAD utility tool then checks the next selected via and tries to repair it. After checking and repairing all the vias in the database, the database can be used for generating photo masks.

It is not guaranteed that all the vias can be repaired, as some of the repairing may violate design rules. However, by using the preferred embodiments of the present invention, the majority of the vias in most integrated circuit designs can be repaired. Exemplary experiment results are shown in Table 1, wherein vias in an integrated circuit having a size of about 17.758*16.008 mm$^2$ are repaired.

TABLE 1

| | Layers | | | | | | |
|---|---|---|---|---|---|---|---|
| | 1 | 2 | 3 | 4 | 5 | 6 | 7 |
| Total vias per layer | 16119942 | 14301281 | 6778642 | 5869312 | 4381317 | 7274640 | 49186489 |
| Vias repaired per layer | 15692380 | 13972352 | 6649848 | 5769533 | 4337504 | 7143696 | 46727165 |
| Repair rate | 97.3% | 97.7% | 98.1% | 98.3% | 99.0% | 98.2% | 95.0% |

In Table 1, "Layers" represents a specific metallization layer on which the respective vias are formed. "Total vias per layer" represents the total number of the vias in one layer in the tested integrated circuit, and "Vias repaired per layer" represents the number of vias repaired by the CAD utility tool. The remaining vias are not repairable as the repair would violate design rules. It is noted that on each layer between about 95% and 99% of vias are repaired. Therefore, the possibility of having shorted vias is significantly reduced.

Figure 6:
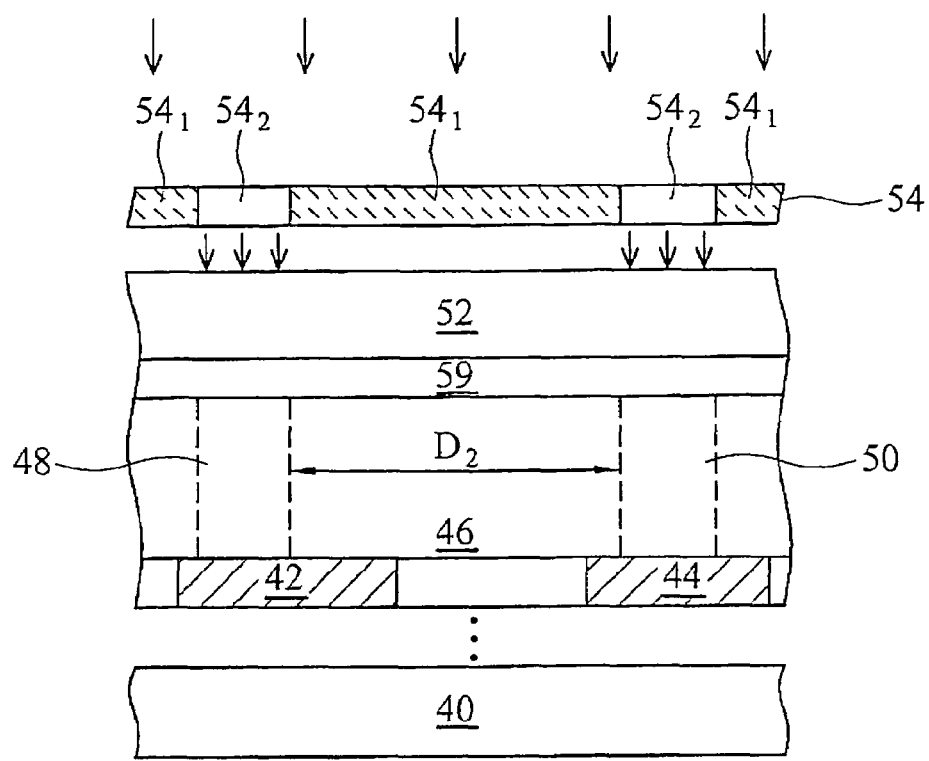
FIGS. 6 through 9 are cross-sectional views of intermediate stages in the manufacture of the preferred embodiment.

An example of using the photo masks created using the previously discussed embodiments is shown in FIG. 6, which illustrates an intermediate step in the formation of the structure shown in FIG. 5A. The steps for forming the structure in FIG. 6 are known in the art, and thus are not repeated herein. In the preferred embodiment, the vias are formed over a substrate 40, which preferably comprises single crystalline silicon or germanium. In alternative embodiments, the substrate 40 comprises group III elements such as boron and gallium, or group IV elements such as phosphorous and arsenic. After the formation of devices (not shown), a first conductive line 42 and a second conductive line 44 are formed in a metal layer, on which a dielectric layer 46 is formed. The conductive lines 42 and 44 preferably comprise commonly used conductive materials such as doped polysilicon, metals such as copper aluminum, tungsten, metal alloys such as copper alloy and aluminum alloy, metal silicides, metal nitrides, and the like. The dielectric layer 46 preferably has a low dielectric constant (k) value. More preferably, the k value is less than about 3.2. The preferred material of the dielectric layer 46 includes carbon-doped silicon oxide, fluoro-silicate glass (FSG), phospho-silicate glass (PSG), borophospho-silicate glass (BPSG), and the like. Another dielectric layer 59 is formed on the dielectric layer 46. Alternatively, the dielectric layer 59 is not formed, and the subsequently formed vias and upper-level metal lines are all formed in the dielectric layer 46.

A photosensitive layer 52 is applied over the dielectric layer 46. The photosensitive layer 52 may be a positive photo resist or a negative photo resist. A photo mask 54 is then placed over the photosensitive layer 52. The photo mask 54 includes transparent and opaque portions that form rectangular via patterns. For example, in a positive photo resist 52, portions $54_2$ are transparent and portions $54_1$ are opaque. Portions $54_2$ define the regions 48 and 50 for subsequently formed vias. As previously discussed, the spacing $D_2$ between the regions 48 and 50 is preferably greater than the minimum spacing.

Figure 7:
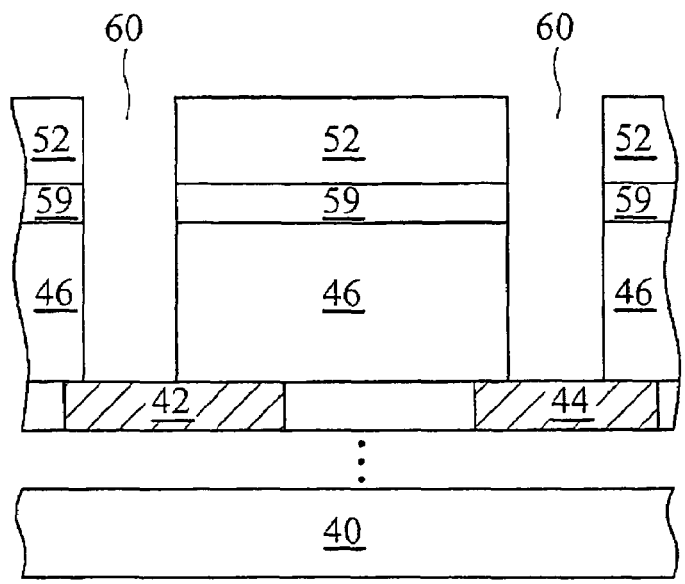

After exposing the photosensitive layer 52, the photo mask 54 is removed, and the photosensitive layer 52 is patterned. The dielectric layer 46 is then etched anisotropically, forming via openings 60, as shown in FIG. 7.

Figure 8:
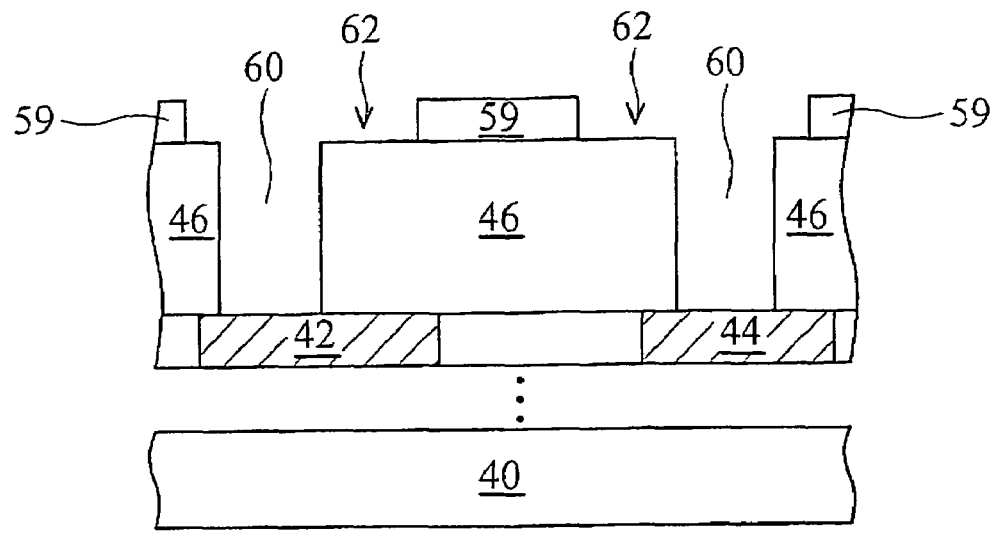

Referring to FIG. 8, trench openings 62 are formed in the dielectric layer 59 using similar steps for forming the via openings 60.

Figure 9:
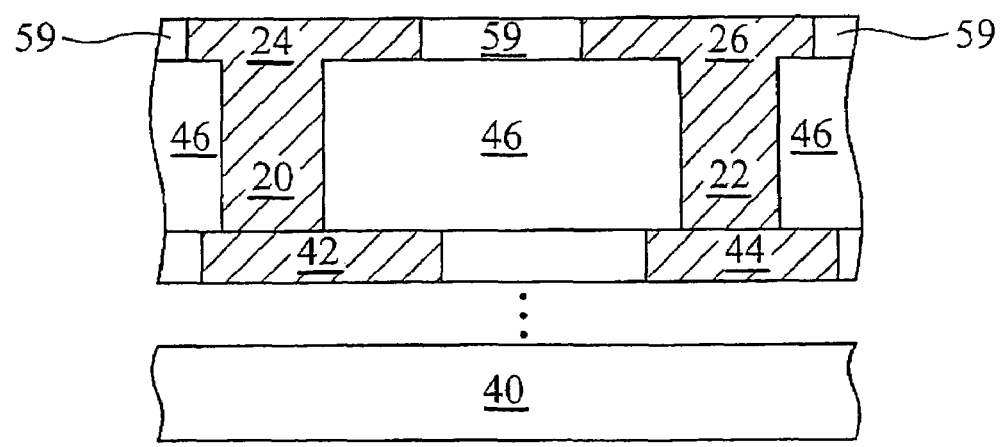

FIG. 9 illustrates the formation of vias 20 and 22 and upper-level conductive lines 24 and 26. As known in the art, a conductive material, such as copper, tungsten, metal alloys, metal silicide, and metal nitrides, may be filled into the via openings 60 and trench openings 62. A chemical mechanical polish (CMP) is performed to planarize the surface, leaving metal lines 24 and 26 and vias 20 and 22.

Figure 10:
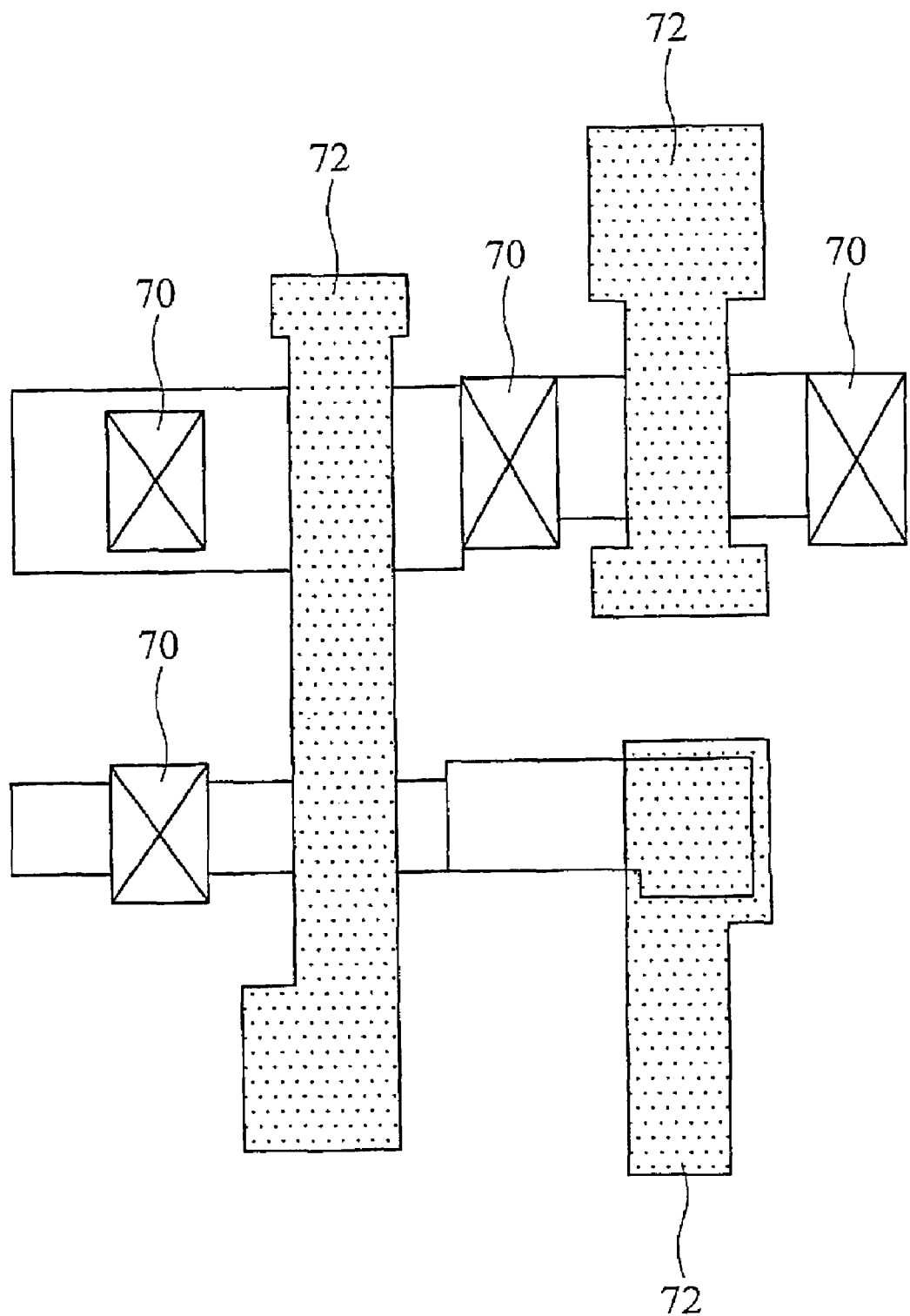
FIG. 10 illustrates a preferred embodiment of the present invention, wherein contacts have rectangular shapes.

Besides forming vias substantially free of short failures, the concept of analyzing and repairing can also be used for the formation of other vertical conductive features. For example, the formation of contacts suffers a similar problem to that of vias, and can be repaired by using the same method provided in the preferred embodiments of the present invention. FIG. 10 illustrates a layout diagram with repaired contacts. Contacts 70 have a nominally rectangular shape, so that the spacing between the contacts 70 is increased. The spacing between contacts 70 and gates 72 is also increased. The preferred embodiments of the present invention, therefore, include checking each contact and making repairs if possible.

Figure 11:
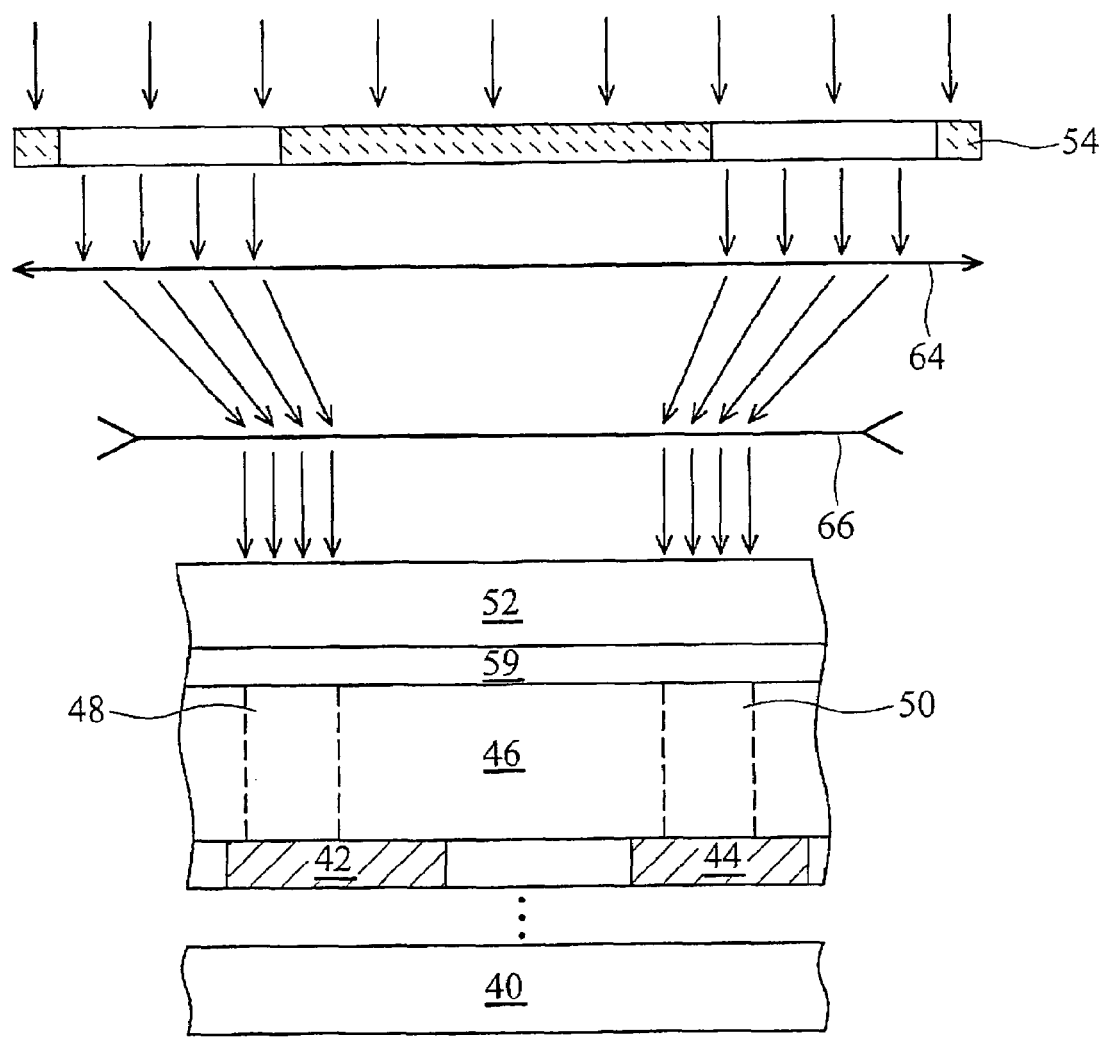
FIG. 11 illustrates a scaled photo mask used in the exposure of a photo resist.

The photo masks can be in a same scale of the desired size, or in a scale that is a multiple of the size of the vertical conductive features, such as 4× or 5×. FIG. 11 schematically illustrates a scaled photo mask 54 used for exposing a photo resist 52. After passing the photo mask 54, parallel light rays are converged by a converging lens 64 and a diverging lens 66. An image having a desired size is formed and used to expose the photo resist 52.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An automated method for repairing spacing of vertical conductive features in the fabrication of semiconductor integrated circuits, the method comprising:
   determining a minimum spacing;
   using a database, identifying vertical conductive feature patterns having a spacing less than the minimum spacing;
   for each identified vertical conductive feature pattern having a spacing less than the minimum spacing, determining a first direction to expand and a second direction to shrink to define a revised vertical conductive feature pattern;
   checking the revised vertical conductive feature pattern against design rules to see if the design rules are violated; and
   for each identified vertical conductive feature pattern having a spacing less than the minimum spacing, replacing the identified vertical conductive feature pattern with the revised vertical conductive feature pattern when the design rules are not violated, wherein the revised vertical conductive feature pattern is expanded in the first direction and shrunk in the second direction.

2. The method of claim 1, wherein the vertical conductive feature patterns include via patterns.

3. The method of claim 1, wherein the vertical conductive feature patterns include contact patterns.

4. The method of claim 1 further comprising saving the revised vertical conductive feature pattern in the database.

5. The method of claim 1 further comprising forming a photo mask after the step of replacing the identified vertical conductive feature pattern with the revised vertical conductive feature pattern.

6. The method of claim 5 further comprising:
   forming a first lower-level conductive line and a second lower-level conductive line;
   forming a dielectric layer on the first and the second lower-level conductive lines;
   forming a photosensitive layer over the dielectric layer;
   placing the photo mask on the photosensitive layer;
   exposing the photosensitive layer;
   patterning the photosensitive layer;
   etching the dielectric layer and forming openings; and
   filling the openings with a conductive material.

7. The method of claim 1, wherein the method is performed by a computer aided design utility tool.

8. The method of claim 1, wherein the revised vertical conductive feature pattern has a size substantially close to a size of the respective identified vertical conductive feature pattern.

9. The method of claim 1, wherein the revised vertical conductive feature pattern has a size substantially greater than a size of the respective identified vertical conductive feature pattern.

10. The method of claim 1, wherein the first direction is in a direction parallel to a longitudinal direction of a metal line connecting to the respective identified vertical conductive feature pattern.

11. A method of forming a photo mask used in integrated circuit fabrication processes, the method comprising:

determining a minimum spacing;

identifying patterns having a spacing less than the minimum spacing, wherein the patterns are for forming vertical conductive features;

for each identified pattern, determining a first direction to expand and a second direction to shrink to define a revised pattern;

checking against design rules to see if the design rules are violated if the respective identified pattern is expanded in the first direction and shrunk in the second direction;

replacing each identified pattern with the respective revised pattern when the design rules are not violated, wherein the revised pattern is expanded in the first direction and shrunk in the second direction; and forming a photo mask using the revised pattern.

* * * * *